(12) United States Patent
Jung

(10) Patent No.: US 11,869,575 B2
(45) Date of Patent: Jan. 9, 2024

(54) MEMORY DEVICE HAVING LOW WRITE ERROR RATE

(71) Applicant: Samsung Electronics Co., Ltd., Suwon-si (KR)

(72) Inventor: Sang-Hoon Jung, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 16 days.

(21) Appl. No.: 17/563,619

(22) Filed: Dec. 28, 2021

(65) Prior Publication Data

US 2022/0122649 A1 Apr. 21, 2022

Related U.S. Application Data

(62) Division of application No. 16/691,127, filed on Nov. 21, 2019, now Pat. No. 11,238,918.

(30) Foreign Application Priority Data

Apr. 18, 2019 (KR) .................. 10-2019-0045314

(51) Int. Cl.
*G11C 11/40* (2006.01)
*G11C 11/408* (2006.01)
(Continued)

(52) U.S. Cl.
CPC ........ *G11C 11/4085* (2013.01); *G11C 11/409* (2013.01); *G11C 11/4087* (2013.01);
(Continued)

(58) Field of Classification Search
CPC ... G11C 11/4085; G11C 7/106; G11C 7/1087; G11C 7/222; G11C 11/4087; G11C 11/409
See application file for complete search history.

(56) References Cited

U.S. PATENT DOCUMENTS 6,256,224 B1 7/2001 Perner et al.
6,356,473 B1 * 3/2002 Shimoyama ............ G11C 8/18
365/189.04
(Continued)

FOREIGN PATENT DOCUMENTS

JP 4245317 B2 3/2009
JP 5166322 B2 3/2013
(Continued)

OTHER PUBLICATIONS

First Office Action dated Nov. 21, 2022 by the Korean Intellectual Property Office for corresponding application KR 10-2019-0045314.

*Primary Examiner* — Tuan T Nguyen
(74) *Attorney, Agent, or Firm* — Muir Patent Law, PLLC

(57) ABSTRACT

A memory device includes a cell array including cells, an address transition detector outputting a transition detection signal as to whether an address of a write command is changed, and a control logic circuit generating one of word-line-on signals for performing a write operation on the cell array in response to the write command, and terminating the write operation in accordance with the transition detection signal. The word-line-on signals include a long-kept word-line-on signal that stays active before the address is changed and a divided word-line-on signal that is, before the address is changed, divided into sub-word-line-on signals.

6 Claims, 17 Drawing Sheets

(51) Int. Cl.
*G11C 11/409* (2006.01)
*G11C 7/22* (2006.01)
*G11C 7/10* (2006.01)

(52) U.S. Cl.
CPC ............ *G11C 7/106* (2013.01); *G11C 7/1087* (2013.01); *G11C 7/222* (2013.01)

(56) References Cited

U.S. PATENT DOCUMENTS

| | | | |
|---|---|---|---|
| 6,928,017 B2* | 8/2005 | Yahata | G11C 11/406 |
| | | | 365/233.5 |
| 8,723,557 B2 | 5/2014 | Ong et al. | |
| 9,378,792 B2 | 6/2016 | Houssameddine | |
| 9,627,075 B1* | 4/2017 | Park | G11C 7/22 |
| 2003/0063512 A1* | 4/2003 | Takahashi | G11C 11/406 |
| | | | 365/222 |
| 2004/0240292 A1 | 12/2004 | Sakata et al. | |
| 2006/0248293 A1 | 11/2006 | Mailloux et al. | |
| 2013/0268727 A1* | 10/2013 | Sohn | G11C 8/00 |
| | | | 365/230.01 |

FOREIGN PATENT DOCUMENTS

| | | |
|---|---|---|
| KR | 10-2018-0091666 A | 8/2008 |
| KR | 10-0869658 B1 | 11/2008 |
| KR | 10-2016-0074617 A | 6/2016 |

* cited by examiner

MEMORY DEVICE HAVING LOW WRITE ERROR RATE

This application is a divisional of U.S. application Ser. No. 16/691,127 filed on Nov. 21, 2019 which claims the benefit of Korean Patent Application No. 10-2019-0045314, filed on Apr. 18, 2019, in the Korean Intellectual Property Office, the disclosure of each of which is incorporated herein in its entirety by reference.

BACKGROUND

1. Technical Field

The present inventive concept relates to a memory device.

2. Description of the Related Art

With speeding-up and low-power consumption of electronic devices, memory devices built in the electronic devices also require high-speed read/write operations and low operating voltages. A random access memory (RAM) may be volatile or non-volatile. A volatile RAM loses information stored in the volatile random access memory each time power is removed, and meanwhile, a non-volatile random access memory may keep the memory contents of the non-volatile random access memory, even when power is removed from the memory.

However, in the case of such a non-volatile random access memory, a success rate and a write error rate (WER) of the write operation exist, and it is necessary to operate in a direction in which the write error rate is low. The write error rate is related to the write time and number.

SUMMARY

Aspects of the present inventive concept provide a highly-reliable memory device.

According to an exemplary embodiment of the present inventive concept, a memory device includes a cell array including a plurality of cells, an address register configured to receive a first address and latch the first address, an address transition detector configured to receive a second address and detect change of the second address from the latched first address and output, when the change of the second address is detected, a transition detection signal, and a control logic circuit configured to start a write operation on the cell array using the first address by a write signal and terminate the write operation in response to the transition detection signal.

According to an exemplary embodiment of the present inventive concept, a memory device includes a cell array including a plurality of cells, an address transition detector configured to output a transition detection signal as to whether an address of a write command is changed, and a control logic circuit configured to generate one of a plurality of word-line-on signals for performing a write operation on the cell array in response to the write command, and terminate the write operation in accordance with the transition detection signal. The plurality of word-line-on signals include a long-kept word-line-on signal that stays active before the address is changed and a divided word-line-on signal that is, before the address is changed, divided into a plurality of sub-word-line-on signals.

According to an exemplary embodiment of the present inventive concept, a memory device includes a cell array including a plurality of memory cells each including a pinned layer having a pinned magnetization direction, a free layer having a variable magnetization direction, and a tunnel barrier layer interposed between the pinned layer and the free layer, an address transition detector configured to detect whether an address of a write command is changed and in response to the detection result, output a transition detection signal, a mode register configured to generate a pre-charge pulse in response to an operation mode of the memory device and a control logic circuit configured to execute a write operation by a write signal, and terminate the write operation of the address in accordance with the transition detection signal and further configured to generate one of a plurality of word-line-on signals in response to the pre-charge pulse. The operation mode includes a first mode and a second mode. In the first mode, the word-line-on signal stays active before the address of the write command is changed, and in the second mode, the word-line-on signal is terminated and another word-on signal is generated before the address of the write command is changed.

However, aspects of the present inventive concept are not restricted to the one set forth herein. The above and other aspects of the present inventive concept will become more apparent to one of ordinary skill in the art to which the present inventive concept pertains by referencing the detailed description of the present inventive concept given below.

BRIEF DESCRIPTION OF THE DRAWINGS

The above and other aspects and features of the present inventive concept will become more apparent by explaining in detail exemplary embodiments thereof with reference to the attached drawings, in which.

DETAILED DESCRIPTION OF THE EMBODIMENTS

Hereinafter, a memory device according to some embodiments of the present inventive concept will be described with reference to FIGS. 1 through 8.

Figure 1:
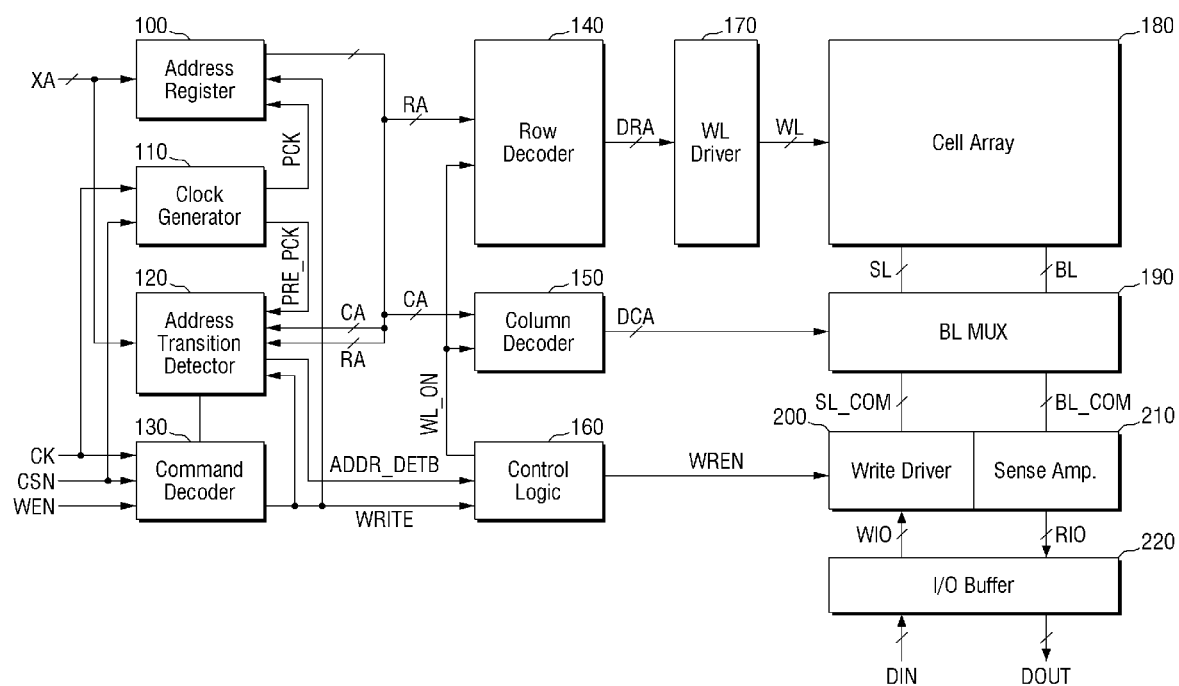
FIG. 1 is a block diagram for explaining a memory device according to some embodiments of the present inventive concept.

FIG. 1 is a block diagram for explaining the memory device according to some embodiments of the present inventive concept.

Referring to FIG. 1, the memory device according to some embodiments of the present inventive concept may include an address register 100, a clock generator 110, an address transition detector 120, a command decoder 130, a row decoder 140, a column decoder 150, a control logic 160 (which is also referred to as a control logic circuit), a word line driver 170, a cell array 180, a multiplexer 190, a write driver 200, a sense amplifier 210, and an I/O buffer 220.

The address register 100 may receive an address XA from the outside. For example, the address register 100 may receive the address XA from a memory controller. The address register 100 may latch the received address XA by dividing it into a row address RA and a column address CA. The address register 100 may transmit the row address RA and the column address CA to the row decoder 140 and the column decoder 150 respectively.

The address register 100 may receive a first clock PCK from the clock generator 110. The address register 100 may receive a write signal WRITE from the command decoder 130. The address register 100 may latch the row address RA and the column address CA of the write command through the write signal WRITE and the first clock PCK.

The address register 100 may transmit the row address RA and the column address CA to the address transition detector 120.

The clock generator 110 may receive a clock CK from the outside. The clock generator 110 may generate the first clock PCK and a second clock PRE_PCK on the basis of the clock CK. Here, the first clock PCK and the second clock PRE_PCK may have the same cycle as that of the clock CK. For example, the first clock PCK and the second clock PRE_PCK may be at the same frequency as that of the clock CK. However, the first clock PCK may be shifted in comparison with the clock CK. For example, the first clock PCK may be delayed from the clock CK. The second clock PRE_PCK may be similar to the clock CK rather than the first clock PCK. The second clock PRE_PCK may be shifted equally to or slightly from the clock CK. For example, the second clock PRE_PCK may be in-phase with the clock CK. Thus, the time point of a rising edge of the second clock PRE_PCK may be the same as or slightly later than the time point of a rising edge of the clock CK, and the time point of a rising edge of the first clock PCK may be after the time point of the rising edge of the second clock PRE_PCK or after the time point of the rising edge of the clock CK.

The clock generator 110 may supply the first clock PCK to the address register 100 and may transmit the second clock PRE_PCK to the address transition detector 120.

Figure 6:
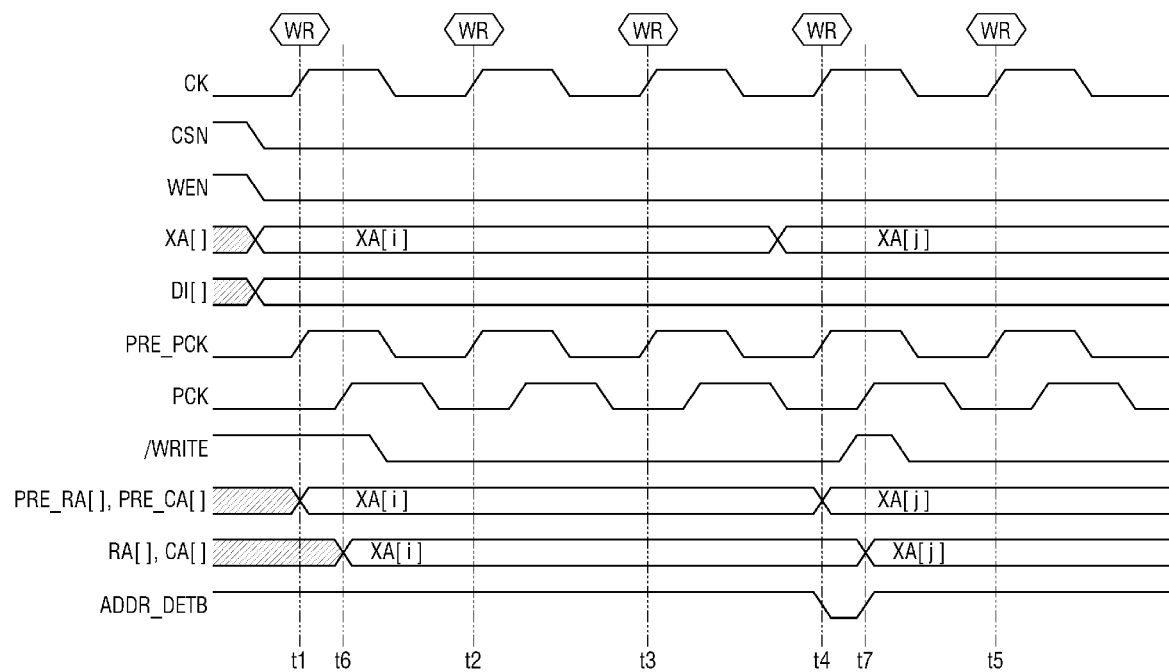
FIG. 6 is a timing diagram for explaining an operation according to time of the address transition detector of the memory device of FIG. 1.

Accordingly, the output of the address register 100 synchronized with the first clock PCK may be caught to be later than the output synchronized with the second clock PRE_PCK of the address transition detector 120. For the convenience of description, the address XA may include a first address XA[i] and a second address XA[j] immediately following the first address XA[i], as shown in FIG. 6, for example. The address register 100 may latch the first address XA[i] and the second address XA[j] in response to the first clock PCK delayed from the clock CK, and the address transition detector 120 may latch the first address XA[i] and the second address XA[j] in response to the second clock PRE_PCK which is in-phase with the clock CK. In this case, as shown in FIG. 6, at a time point t4, the first address XA[i] latched in the address transition detector 120 is switched to the second address XA[j] in response to the second clock PRE_PCK, but the address register 100 still holds the latched first address XA[i] and the latched address XA[i] of the address register 100 is switched to the second address XA[j] at a time point t7. Thus, the address change from the first address XA[i] to the second address XA[j] may be detected by the address transition detector 120 between the time point t4 and the time point t7.

The address transition detector 120 may receive the address XA from the outside. The address transition detector 120 may receive the second clock PRE_PCK from the clock generator 110. The address transition detector 120 may receive the row address RA and the column address CA from the address register 100. The address transition detector 120 may receive the write signal WRITE from the command decoder 130.

The address transition detector 120 may detect whether the address XA of the write command is changed to generate a transition detection signal ADDR_DETB. The address transition detector 120 may transmit the transition detection signal ADDR_DETB to the control logic 160. As described above, as shown in FIG. 6, the address transition detector 120, when receiving the second address XA[j], may change its previously-latched address (e.g., the first address XA[i]) to the second address XA[j] in response to the second clock PRE_PCK which is in-phase with the clock CK. The address transition detector 120 also receives the first address XA[j] latched by the address register 100 in response to the first clock PCK delayed from the clock CK (i.e., the address register 100 latches the second address XA[j] later than the address transition detector 120), and the address transition detector 120 detects the change of the address XA by comparing the latched address (the second address XA[j]) by the address transition detector 120 and the latched address (the first address XA[i]) by the address register 100. The configuration and operation of the address transition detector 120 will be described in detail later.

The command decoder 130 may receive the clock CK, a negative chip selection signal CSN, and a negative write enable signal WEN from the outside. At this time, when the negative chip selection signal CSN is high, it may be interpreted that a signal is not applied, and when the negative chip selection signal CSN is a low signal, it may be interpreted that a signal is applied. Since this may differ depending on the internal implementation, the present embodiment is not limited thereto.

The negative write enable signal WEN may be a signal corresponding to the write command. That is, when the write command is applied, the negative write enable signal WEN may be applied to be low. The negative write enable signal WEN may be a signal indicating that the write operation needs to be performed with application of the write command. The negative chip selection signal CSN may be a signal that selects a chip to be driven by a memory device made up of a plurality of chips.

The command decoder 130 may generate the write signal WRITE in accordance with the negative chip selection signal CSN and the negative write enable signal WEN, and may transmit the write signal WRITE in synchronization with the clock CK. The command decoder 130 may transmit the write signal WRITE to the address register 100, the address transition detector 120 and the control logic 160.

The row decoder 140 may receive the row address RA from the address register 100. The row decoder 140 may receive a word-line-on signal WL_ON from the control logic 160. The row decoder 140 may decode the row address RA to generate a decoded row address DRA. The row decoder 140 may transmit the decoded row address DRA to the word line driver 170. The row decoder 140 may transmit the decoded row address DRA only when receiving the word-line-on signal WL_ON.

The word line driver 170 may control the voltages of the word lines WL of the cell array 180 in accordance with the decoded row address DRA. For example, the word line driver 170 may apply the voltage for reading or writing to the word line WL selected by the row address RA, and may apply the voltage (or voltages) for inhibiting the reading or writing to other word lines WL not selected by the decoded row address DRA.

The column decoder 150 may receive the column address CA from the address register 100. The column decoder 150 may receive the word-line-on signal WL_ON from the control logic 160. The column decoder 150 may decode the column address CA to generate a decoded column address DCA. The column decoder 150 may transmit the decoded column address DCA to the multiplexer 190. The column decoder 150 may transmit the decoded column address DCA only when receiving the word-line-on signal WL_ON.

The control logic 160 may receive the write signal WRITE from the command decoder 130. The control logic 160 may receive a transition detection signal ADDR_DETB from the address transition detector 120. The control logic 160 may generate the word-line-on signal WL_ON and a write driver enable signal WREN through the write signal WRITE and the transition detection signal ADDR_DETB.

Figure 17:
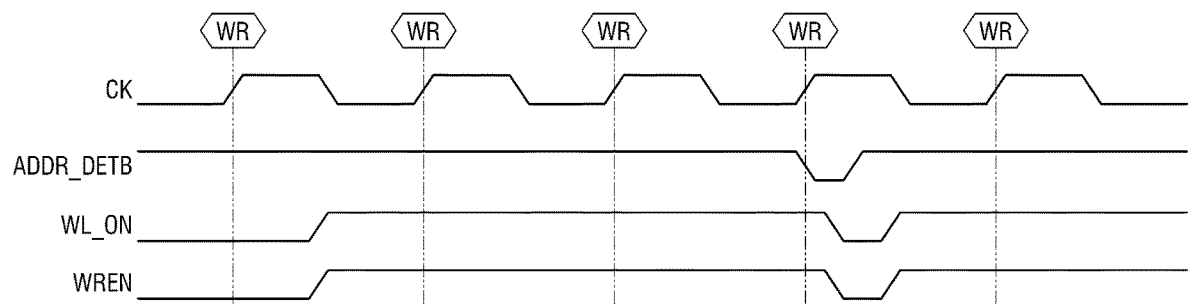
FIG. 17 is a timing diagram for explaining a write on signal according to some embodiments of the present inventive concept.

The control logic 160 may apply each of the word-line-on signal WL_ON and the write driver enable signal WREN to be high in accordance with the write signal WRITE. For example, as shown in FIG. 17, in response to a falling edge of the write signal WRITE, the control logic 160 may generate the word-line-on signal WL_ON and the write driver enable signal WREN that change to high. The control logic 160 may apply the word-line-on signal WL_ON to the row decoder 140 and the column decoder 150, and may apply the write driver enable signal WREN to the write driver 200.

The control logic 160 may apply each of the word-line-on signal WL_ON and the write driver enable signal WREN to be low in accordance with the transition detection signal ADDR_DETB. For example, as shown in FIG. 17, in response to a falling edge of the transition detection signal ADDR_DETB, the control logic 160 generates the word-line-on signal WL_ON and the write driver enable signal WREN that change to low. This allows the control logic 160 to cause the write operation to be terminated.

The cell array 180 may include a plurality of memory cells inside. In the cell array 180, a word line WL and a bit line BL may form a plurality of rows and columns. Also, a source line SL may also be disposed in pairs with the bit line BL. The address XA may be for specifying the memory cell corresponding to any word line WL and any bit line BL.

The cell array 180 may receive application of the voltages of each word line WL from the word line driver 170. The cell array 180 may be connected to the multiplexer 190 through the source line SL and the bit line BL. The data stored or to be stored in the cell array 180 may be output to the multiplexer 190 through the bit line BL or may be input from the multiplexer 190 through the source line SL.

The multiplexer 190 may receive the decoded column address DCA from the column decoder 150. The multiplexer 190 may be connected to the cell array 180, through the source line SL and the bit line BL. The multiplexer 190 may select and output the output of a specific bit line BL among the outputs of the plurality of bit lines BL to the common bit line BL_COM, using the decoded column address DCA.

Similarly, the multiplexer 190 may input the input of the common source line SL_COM, by selecting a specific source line SL using the decoded column address DCA. That is, the multiplexer 190 may also perform the role of the demultiplexer simultaneously.

The write driver 200 may be connected to the memory cell of the cell array 180 via the source line SL. During the write operation, the write driver 200 may apply a write current (or voltage) to the source line SL selected through the common source line SL_COM, via the multiplexer 190, in response to the write driver enable signal WREN. For example, the write driver 200 may apply the write current for a predetermined time during which the write driver enable signal WREN stays high (i.e., when the write operation is performed). The write driver 200 may apply a voltage (or voltages) for inhibiting write to other source lines SL not selected through the multiplexer 190.

The write driver 200 may receive a write driver enable signal WREN from the control logic 160. The write driver 200 may need to receive the write driver enable signal WREN in order to perform the write operations.

The write driver 200 may receive data from the I/O buffer 220 via a write input/output WIO. The write driver 200 may transmit the data, which is received through the write input/output WIO, to the multiplexer 190 via the common source line SL_COM.

The sense amplifier 210 may be connected to the memory cell of the cell array 180 through the source line SL and the bit line BL. At the time of the read operation, the sense amplifier 210 may sense current (or voltage) of the source line SL and the bit line BL selected through the multiplexer 190, the common source line SL_COM and the common bit line BL_COM.

The sense amplifier 210 may receive data from the multiplexer 190 through the common source line SL_COM and the common bit line BL_COM. The sense amplifier 210 may transmit data, which is received through the common source line SL_COM and the common bit line BL_COM, to the I/O buffer 220 via a read input/output RIO.

The I/O buffer 220 may be connected to each of the write driver 200 and the sense amplifier 210 via the write input/output WIO and the read input/output RIO. The I/O buffer 220 may exchange data with an external device. Specifically, the I/O buffer 220 may load data, which is transmitted from an external device through the data input DI and the data output DO, to the write driver 200. The I/O buffer 220 may transfer data detected by the sense amplifier 210 to the external device.

Figure 2:
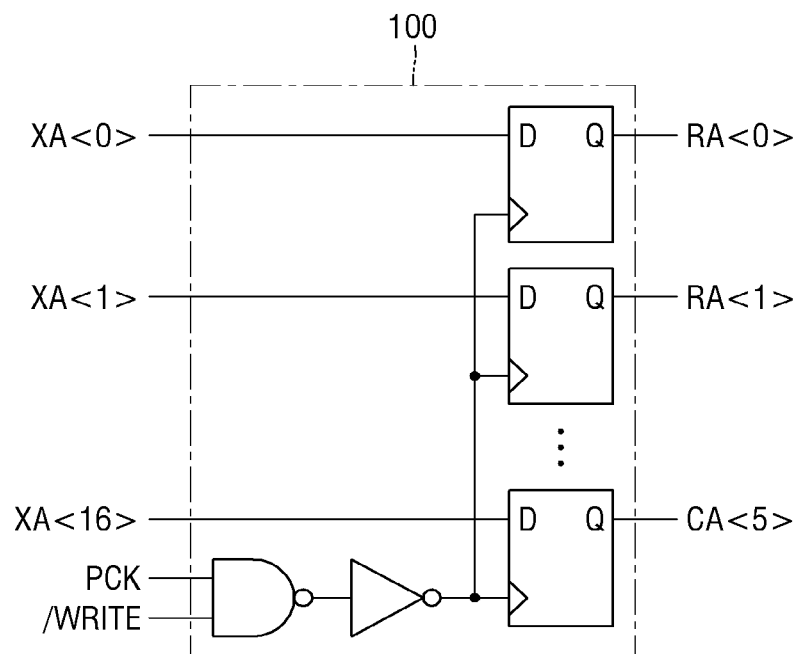
FIG. 2 is a logic circuit diagram for explaining an address register of FIG. 1 in detail.

FIG. 2 is a logic circuit diagram for explaining the address register of FIG. 1 in detail.

Referring to FIGS. 1 and 2, the address register 100 may include a plurality of D flip-flops. The address XA may include, for example, first to seventeenth addresses XA<0> to XA<16>. However, this is only one example and the present embodiment is not limited thereto.

The address register 100 may include seventeen D flip flops each of which corresponding to one of the first to seventeenth addresses XA<0> to XA<16>. Each D flip-flop may perform synchronization, using the first clock PCK and the negative write signal/WRITE as clocks. Here, the negative write signal/WRITE may be a signal obtained by inverting the write signal WRITE.

When the write signal WRITE 15 low, the negative write signal/WRITE may be high, and when the write signal WRITE 15 high, the negative write signal/WRITE may be low. That is, a negative write signal/WRITE may be low when a write command enters. Therefore, when the negative write signal/WRITE becomes low, there may be an effect in which the clock entering the seventeen D flip flops is blocked.

That is, this allows the address register 100 to latch the address XA in accordance with the entry of the write command. For example, when the write command is applied to the command decoder 130 as the negative write enable signal WEN, since it is output as the write signal WRITE by the clock CK, it is delayed compared to the address XA and may be input to the address register 100. Therefore, the write signal WRITE may become high after the address XA is first latched.

When the write signal WRITE becomes high, since the negative write signal/WRITE becomes low and the clock portion of the D flip-flop becomes low, the already latched address XA does not change. The latched address XA will be latched again when the write signal WRITE becomes low again.

Each D flip-flop latches the first to seventeenth addresses XA<0> to XA<16>, and may output first to eleventh row addresses RA<0> to RA<10>, and first to sixth column addresses CA<0> to CA<5>. At this time, the first to eleventh row addresses RA<0> to RA<10> may be row addresses RA, and the first to sixth column addresses CA<0> to CA<5> may be column addresses CA. The row address RA may be transmitted to the row decoder 140 and the address transition detector 120, and the column address CA may be transmitted to the column decoder 150 and the address transition detector 120.

Figure 3:
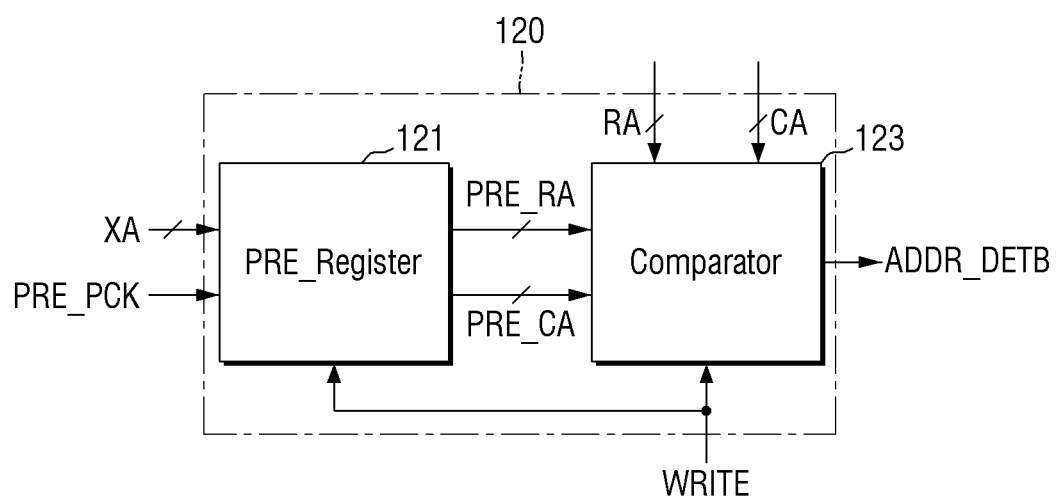
FIG. 3 is a block diagram for explaining an address transition detector of FIG. 1 in detail.

FIG. 3 is a block diagram for explaining the address transition detector of FIG. 1 in detail.

Referring to FIGS. 1 to 3, the address transition detector 120 may include a pre-register 121 and a comparator 123.

The pre-register 121 may latch the address XA similar to the address register 100. The pre-register 121 may receive the write signal WRITE, the address XA, and the second clock PRE_PCK. This allows the pre-register 121 to latch the pre-row address PRE_RA and the pre-column address PRE_CA.

The pre-row address PRE_RA may be latched slightly earlier than the row address RA, and the pre-column address PRE_CA may be latched slightly earlier than the column address CA. The reason is that the second clock PRE_PCK is shifted from the clock CK to a lesser extent than the first clock PCK.

The comparator 123 may receive the row address RA and the column address CA from the address register 100. The comparator 123 may receive the pre-row address PRE_RA and the pre-column address PRE_CA from the pre-register 121. The comparator 123 may also receive the write signal WRITE.

The comparator 123 may compare the row address RA with the pre-row address PRE_RA, compare the column address CA with the pre-column address PRE_CA, and may output a transition detection signal ADDR_DETB according to a comparison result between the row address RA with the pre-row address PRE_R and/or a comparison result between the column address CA with the pre-column address PRE_CA.

Figure 4:
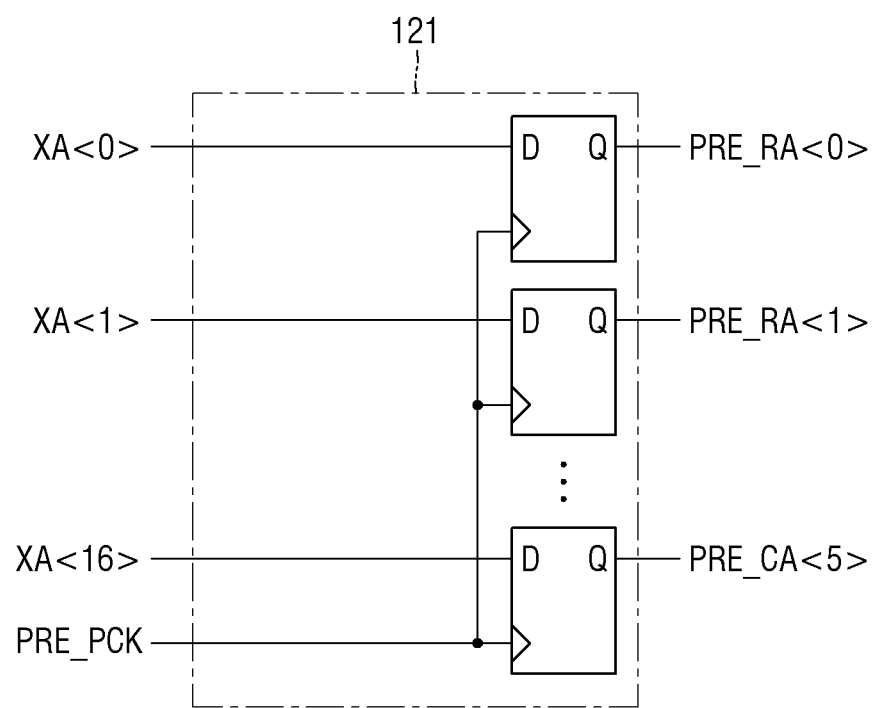
FIG. 4 is a logic circuit diagram for explaining a pre-register of FIG. 3 in detail.

FIG. 4 is a logic circuit diagram for explaining the pre-register of FIG. 3 in detail.

Referring to FIGS. 1 to 4, the pre-register 121 may have a structure similar to the address register 100. The pre-register 121 may include a plurality of D flip flops.

The pre-register 121 may include seventeen D flip flops each of which corresponding to one of the first to seventeenth addresses XA<0> to XA<16>. Each D flip-flop may perform synchronization, using the second clock PRE_PCK as a clock.

Thus, the pre-register 121 may latch the address XA in accordance with the entry of the write signal WRITE.

Each D flip-flop may latch the first to seventeenth addresses XA<0> to XA<16>, and may output first to eleventh pre-row addresses PRE_RA<0> to PRE_RA<10>, and first to sixth pre-column addresses PRE_CA<0> to PRE_CA<5>. At this time, the first to eleventh pre-row addresses PRE_RA<0> to PRE_RA<10> may be pre-row address PRE_RA, and the first to sixth pre-column addresses PRE_CA<0> to PRE_CA<5> may be pre-column address PRE_CA. The pre-row address PRE_RA may be transmitted to the comparator 123, and the pre-column address PRE_CA may be transmitted to the comparator 123.

Figure 5:
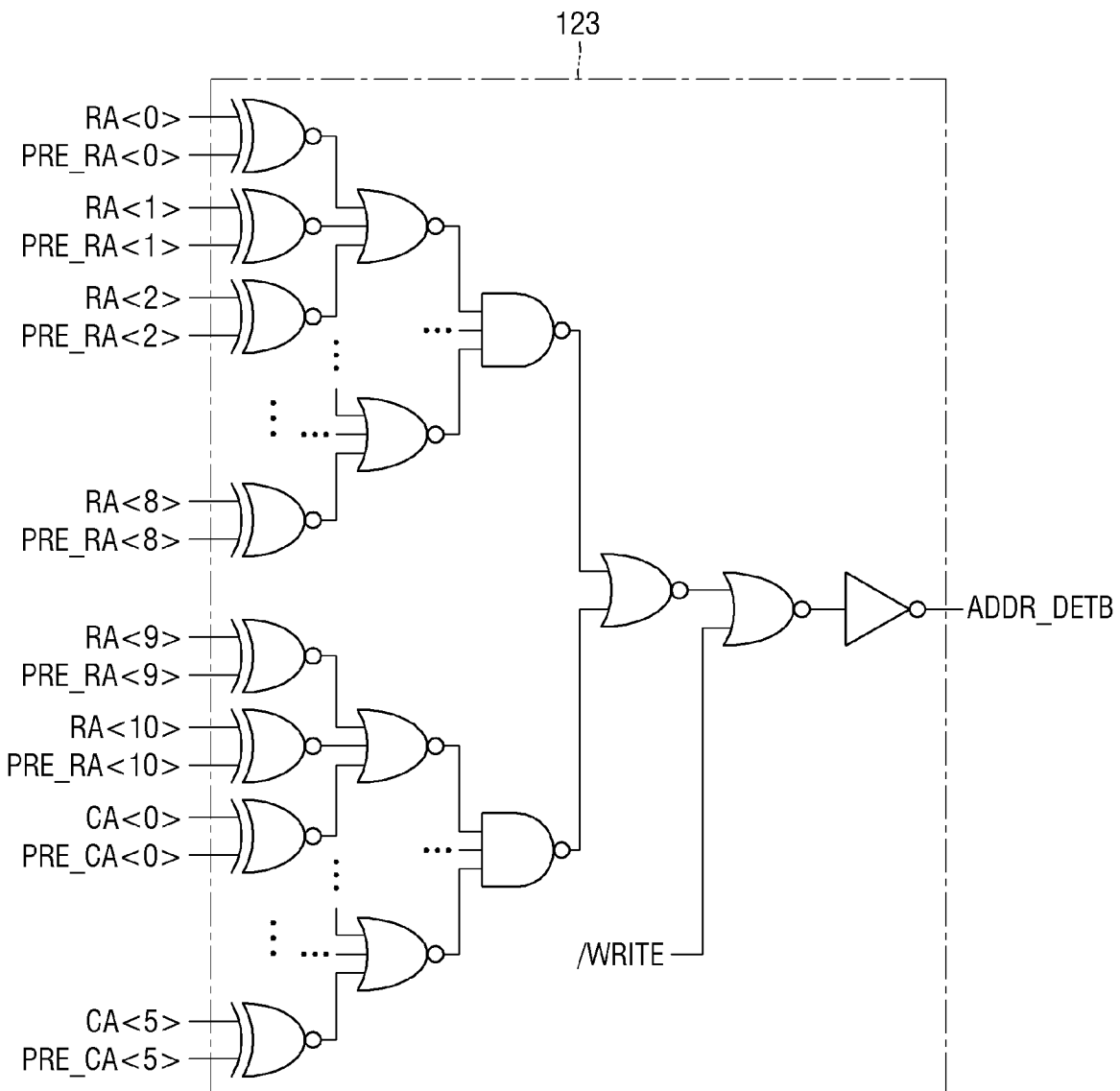
FIG. 5 is a logic circuit diagram for explaining a comparator of FIG. 3 in detail.

FIG. 5 is a logic circuit diagram for explaining the comparator of FIG. 3 in detail.

Referring to FIGS. 1 to 5, the comparator 123 may compare the first to eleventh row addresses RA<0> to RA<10> with the first to eleventh pre-row addresses PRE_RA<0> to PRE_RA<10>. Also, the comparator 123 compares the first to eleventh column addresses CA with the first to eleventh pre-column addresses PRE_CA. If the entire address is not completely the same, a transition detection signal ADDR_DETB may be output.

However, since only a write command is relevant, the negative write signal/WRITE is used as an input, and the output may be cut off when there is no write command.

FIG. 6 is a timing diagram for explaining the operation according to time of the address transition detector of the memory device of FIG. 1.

Referring to FIGS. 1 to 6, a plurality of write commands WR may be applied for each rising edge of the clock CK. Specifically, the write commands WR may be applied at a first time point t1, a second time point t2, a third time point t3, a fourth time point t4 and a fifth time point t5, respectively.

Meanwhile, the negative chip selection signal CSN and the negative write enable signal WEN may all be applied to be low, and an address (XA[ ]) may be applied. As the address (XA[ ]), an address i(XA[i]) is applied, and then an address j(XA[j]) may be applied. Therefore, the write command WR is a write command WR for the address i(XA[i]) at the first time point t1, the second time point t2 and the third time point t3. However, the write command WR may be a write command WR for the address j(XA[j]) at the fourth time point t4 and the fifth time point t5.

Data (DI[ ]) for the write command WR may also be applied like the address (XA[ ]).

As described above, the second clock PRE_PCK may be a clock equal to or slightly delayed and shifted from the clock CK, and the first clock PCK may be a clock delayed and shifted from the clock CK to a relatively larger extent than the second clock PRE_PCK. However, since only the delay shift is performed, the first clock PCK and the second clock PRE_PCK have the same cycle as that of the clock CK.

The negative write signal/WRITE may be applied after the address (XA[ ]) is applied. The negative write signal/WRITE may be applied to be high for a while, before a new write command WR with a changed address (XA[ ]) is applied.

The row address (RA[ ]) and the column address (CA[ ]) may be latched by the first clock PCK delayed and shifted to a relatively larger extent, and the address i(XA[i]) may be latched at the sixth time point t6. In contrast, the pre-row address (PRE_RA[ ]) and the column address (PRE_CA[ ]) may be latched by the second clock PRE_PCK delayed and shifted to a relatively lesser extent, and the address i(XA[i]) may be latched at the first time point t1.

Depending on the timing differences, the time point converted to the new address j(XA[j]) may also change. In the row address (RA[ ]) and the column address (CA[ ]), the address j(XA[j]) may be latched at the seventh time point t7. In contrast, in the pre-row addresses (PRE_RA[ ]) and the column address (PRE_CA[ ]), the address j(XA[j]) may be latched at the fourth time point t4.

Therefore, although the pre-row address (PRE_RA[ ]) and the pre-column address (PRE_CA[ ]) may be latched at the fourth time point t4 from the address j(XA[j]), since the row address (RA[ ]) and the column address (CA[ ]) may still latch the address i(XA[i]), the transition detection signal ADDR_DETB may change to be low.

The transition detection signal ADDR_DETB remains low until the seventh time point t7 at which the row address (RA[ ]) and the column address (CA[ ]) may latch the address j(XA[j]), and then may change to high again at the seventh time point t7.

Figure 7:
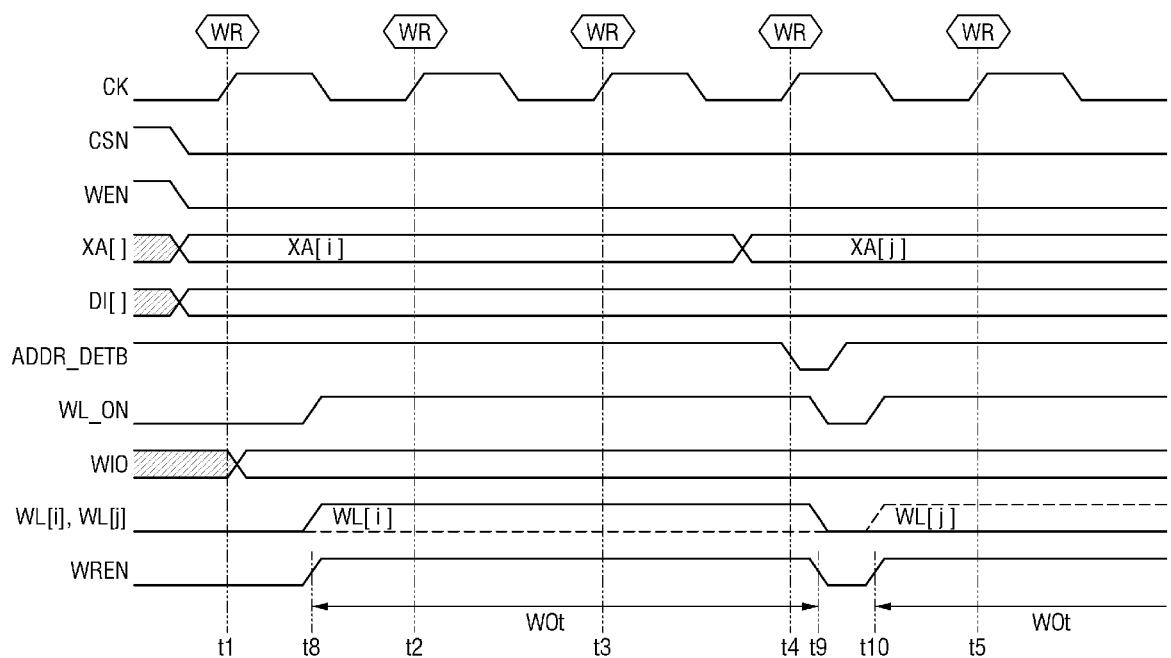
FIG. 7 is a timing diagram for explaining a write operation according to time of the memory device of FIG. 1.

FIG. 7 is a timing diagram for explaining the write operation according to time of the memory device of FIG. 1.

Referring to FIGS. 1 to 7, the write input/output WIO may be applied after the first time point t1 at which the write command WR is applied to the rising edge of the clock CK.

By the write signal WRITE, the word-line-on signal WL_ON may change to high, and then a voltage may be applied to the word line WL by the word line driver 170. For example, in response to a falling edge of the write signal WRITE, the control logic 160 may change the word-line-on signal WL_ON to high at the eighth time point t8. FIG. 7 illustrates a case where the voltage is first applied to the word line i(WL[i]) corresponding to the address i(XA[i]), and then, the voltage is applied to the word line j(WL[i]) corresponding to the address j(XA[j]).

The write driver enable signal WREN may also be changed to high at the eighth time point t8 by the write signal WRITE, like the word-line-on signal WL_ON.

The control logic 160 may change the word-line-on signal WL_ON to low at a ninth time point t9 by the transition detection signal ADDR_DETB, and may change it to high again at a tenth time point t10. In addition, the control logic 160 may also change the write driver enable signal WREN to low at the ninth time point t9 by the transition detect signal ADDR_DETB, like the word-line-on signal WL_ON, and may change it to high again at the tenth time point t10.

For example, the write driver 200 may apply a write current for a predetermined time (i.e., write time) between the eighth time point t8 and the ninth time point t9 during which each of the write driver enable signal WREN and the word-line-on signal WL_ON stays high and the word-line-on signal stays high. The time period of the word-line-on signal WL_ON staying high may be referred to as a pulse width.

Therefore, the write operation time WOt for the word line i(WL[i]) may be kept from the eighth time point t8 to the ninth time point t9. That is, in the duration of the write operation time Wot, the word-line-on signal WL_ON may stay high until the address XA of the write command WR changes to the word line j(WL[j]), that is, the duration of the word-line-on signal WL_ON may be kept without a section that changes to low. For example, the word-line-on signal WL_ON for the word line i(WL[i]) may stay high without changing to low before the address XA changes from the word line i(WL[i]) to the word line j(WL[j]).

That is, an ON ratio of the duration of the word-line-on signal WL_ON, which means the write operation time WOt, may be 100%.

Figure 8:
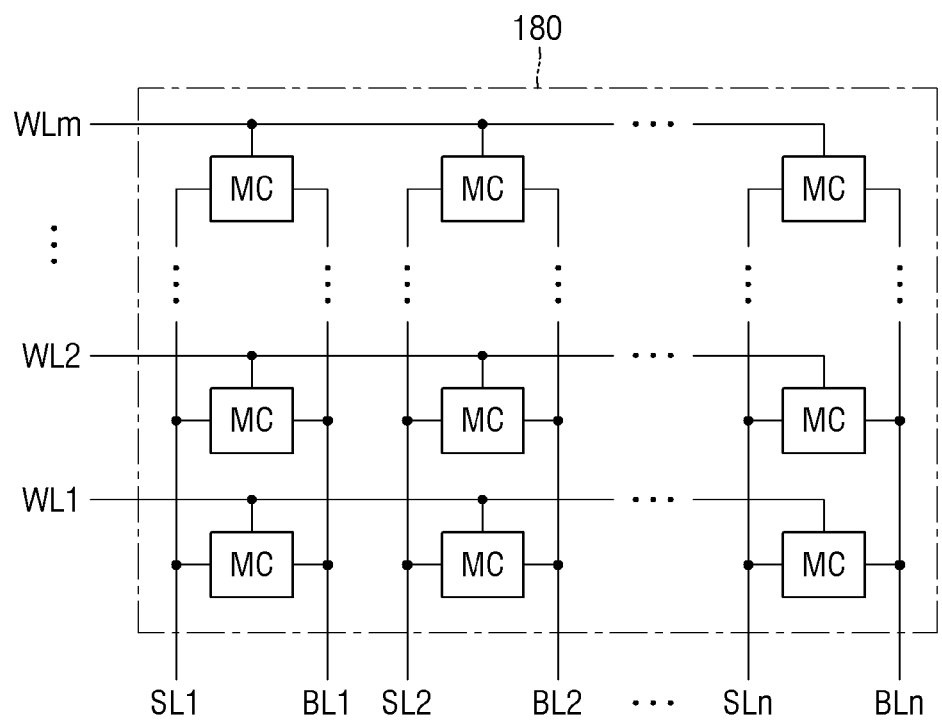
FIG. 8 is an equivalent circuit diagram for explaining a cell array of FIG. 1 in detail.

FIG. 8 is an equivalent circuit diagram for explaining the cell array of FIG. 1 in detail.

Referring to FIGS. 1 to 8, the cell array 180 includes memory cells MC. The memory cells MC are connected to first to nth source lines SL1 to SLn, first to nth bit lines BL1 to BLn, and first to mth word lines WL1 to WLm.

The memory cells MC are arranged by rows and columns. The rows of memory cells MC are connected to the first to m-th word lines WL1 to WLm, respectively. The columns of the memory cell MC are connected to the first to nth source lines SL1 to SLn and the first to nth bit lines BL1 to BLn, respectively.

A memory device according to some embodiments of the present inventive concept may be a variable resistive memory device. For example, the memory device according to some embodiments of the present inventive concept may include at least one of a phase-change random access memory (PRAM), a magnetic random access memory (Magnetic RAM, MRAM), a resistive random access memory (resistive RAM, RRAM), and a ferroelectric random access memory (Ferroelectric RAM, FRAM).

A write error rate (WER) which is a rate at which an error occurs at the time of a write operation is related to a write time which is a holding time of the write operation. For example, the probability that a write error takes place for a write pulse duration (i.e. write time) is called the write error rate (WER). The write pulse duration must be long enough to ensure a low write error rate (WER), the probability that a bit will remain unswitched after the write pulse is turned off, in the presence of stochastic thermal effects. In an exemplary embodiment, some variable resistive memory devices may have a low write error rate in a case where the word-line-on signal WL_ON is divided with short write times and are repeated several times before the change of the address XA, as compared to a case where the write time is kept long without division before the change of the address XA. The variable resistive memory devices, when having a low write error rate at the divided word-line-on signal, may be referred to as a first type variable resistive memory device.

In an exemplary embodiment, some variable resistive memory devices may have a lower write error rate in the case where the write time is kept long without division before the change of the address XA. Therefore, in the variable resistive memory device in which the characteristics of the write error rate and the write time are newly discovered, the write error rate may be lowered when keeping the write time long without division. The variable resistive memory devices, when having a low write error rate at the long-kept word-line-on signal, may be referred to as a second type variable resistive memory device.

Therefore, the memory device according to some embodiments of the present inventive concept is a memory device having characteristics in which the write error rate decreases when the write time is kept long, and it is possible to minimize the write error rate, by keeping the ON ratio of duration of the write operation to 100% (i.e., no division of the word-line-on signal WL_ON before the change in the address XA or the word-line-on signal WL_ON stays active before the address XA changes). In an exemplary embodiment, the divided word-line-on signal or the long-kept word-line-on signal may be selectively applied to have a low write error. Such selective application of the word-line-on signal will be described in detail with reference to FIGS. 11 to 15.

Accordingly, it is possible to provide a highly reliable memory device in which write data is well stored.

Hereinafter, the memory device according to some embodiments of the present inventive concept will be described with reference to FIGS. 1, 9 and 10. Repeated parts of the aforementioned embodiment will be simplified or omitted.

Figure 9:
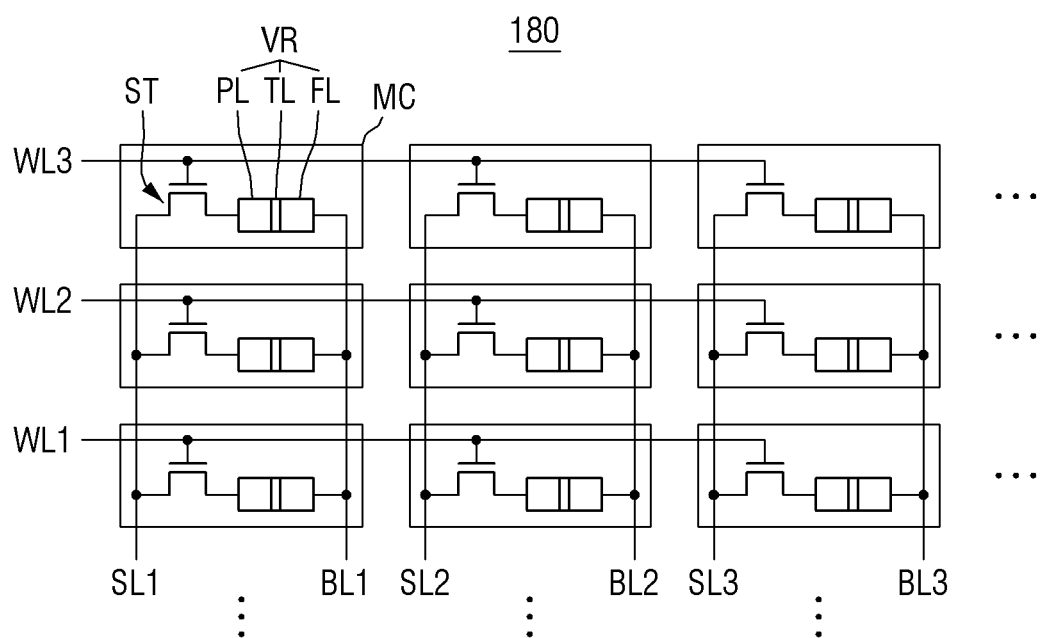
FIG. 9 is an equivalent circuit diagram for explaining the cell array of the memory device according to some embodiments of the present inventive concept.
Figure 10:
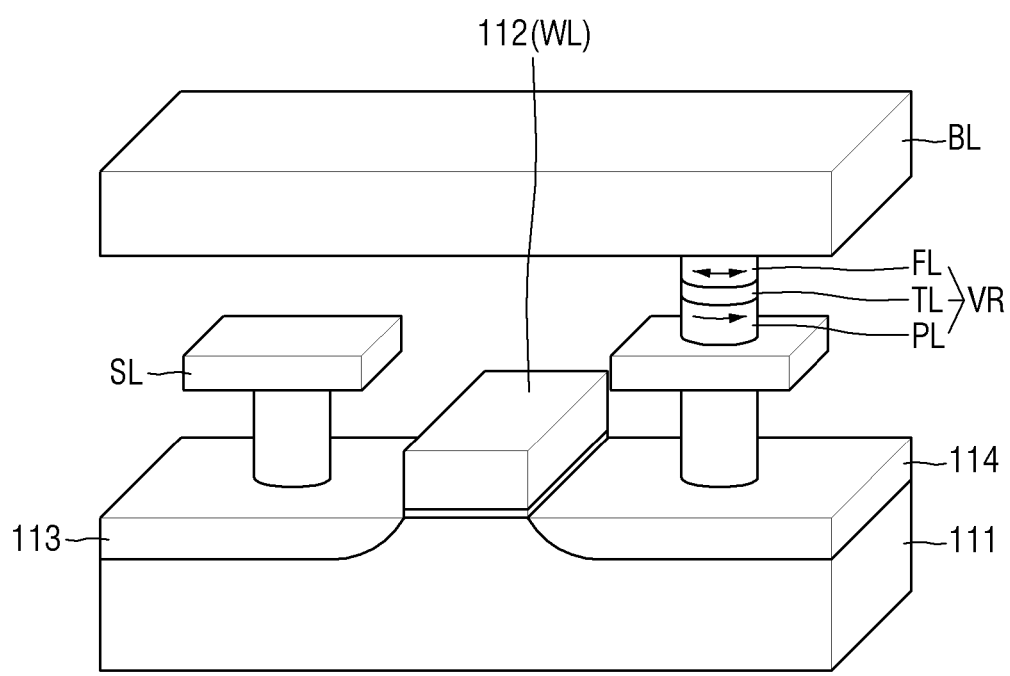
FIG. 10 is a perspective view for explaining a structure of the memory cell of the cell array of FIG. 9.

FIG. 9 is an equivalent circuit diagram for explaining a cell array of the memory device according to some embodiments of the present inventive concept, and FIG. 10 is a perspective view for explaining a structure of the memory cell of the cell array of FIG. 9.

Referring to FIGS. 1, 9 and 10, the memory cells MC of the cell array 180 of the memory device according to some embodiments of the present inventive concept include a selection transistor ST and a variable resistance element VR. For example, the memory device according to some embodiments of the present inventive concept may be a magnetic random access memory.

The selection transistor ST includes a first junction 113 formed in a body 111 and connected to the source line SL, a second junction 114 formed in the body 111 and connected to the bit line BL through the variable resistance element VR, and a gate 112 formed on the body 111 between the first junction 113 and the second junction 114. The gate 112 may correspond to the word line WL The variable resistance element VR includes a pinned layer PL, a tunnel barrier layer TL, and a free layer FL. The pinned layer PL has a pinned magnetization direction. The free layer FL has a magnetization direction that changes depending on the voltage (or current) applied to the variable resistance element VR. The current is a current for performing the write operation, and may be defined as a write current. For example, the current may be a current for switching the magnetization direction of the free layer FL for the write operation, and may be defined as a switching current for the write operation.

The resistance of the variable resistance element VR may change, depending on whether the magnetization direction of the free layer FL is the same as or different from the magnetization direction of the pinned layer PL. The variable resistance element VR may store data in the form of a magnitude of resistance.

The gate 112 may extend in a direction perpendicular to a direction in which the bit line BL extends and may be connected to a gate of a memory cell of another column. The gates of memory cells MC in the same row may be connected together to form a word line WL.

In an exemplary embodiment, a magnetic random access memory, which may be referred to as a first type magnetic random access memory, has a low write error rate when a write time is divided for performing a write operation for a given address. In an exemplary embodiment, a magnetic random access memory, which may be referred to as a second type magnetic random access memory, has a low write error rate when a write time is kept long, without division before the address change. In an exemplary embodiment, the second type magnetic random access memory may be capable of holding data stored in the memory in a high-temperature solder reflow process and the switching current relatively increases.

Thus, as in some embodiments of the present inventive concept, the write operation may be kept long until the write operation is stopped by the address transition detector 120 to lower the write error rate of the magnetic access memory.

The memory device according to some embodiments of the present inventive concept will be described below with reference to FIGS. 11 through 15. Repeated parts of the aforementioned embodiment will be simplified or omitted.

Figure 11:
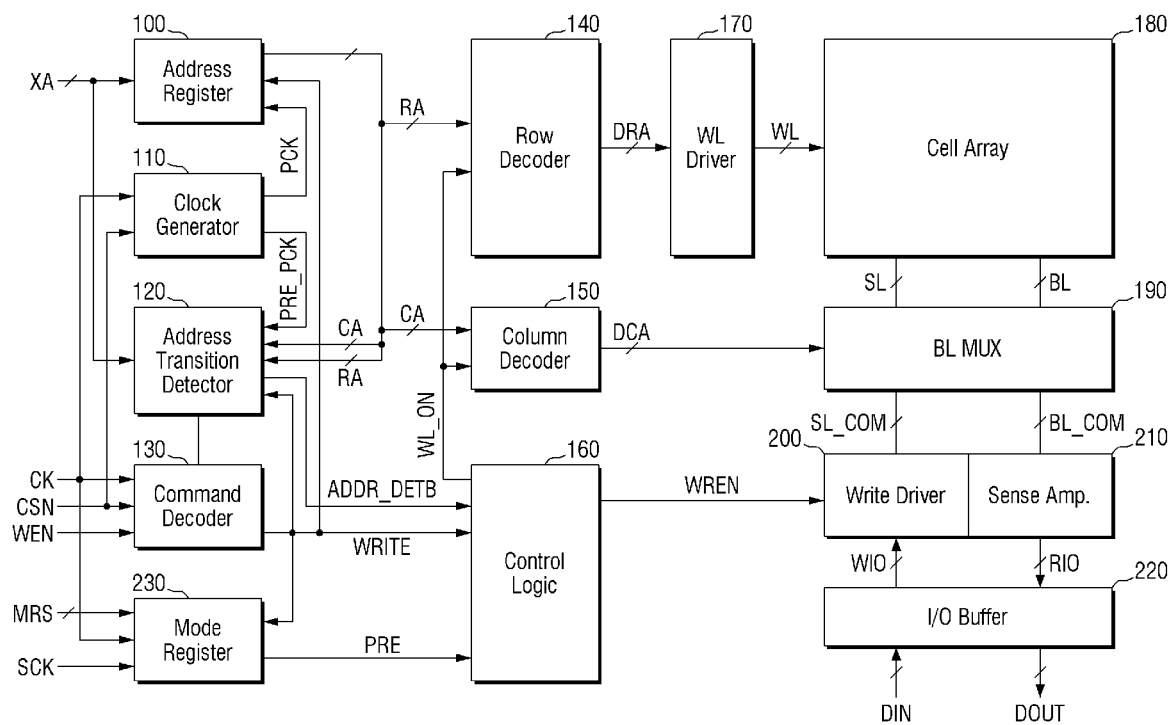
FIG. 11 is a block diagram for explaining the memory device according to some embodiments of the present inventive concept.

FIG. 11 is a block diagram for explaining the memory device according to some embodiments of the present inventive concept.

Referring to FIG. 11, the memory device according to some embodiments of the present inventive concept may further include a first mode register 230.

The first mode register 230 may receive external information MRS from the outside. The first mode register 230 may receive a clock CK or a third clock SCK from the outside. Although FIG. 11 illustrates that the first mode register 230 may receive both the clock CK and the third clock SCK, it is also possible to receive only one of the clock CK and the third clock SCK.

The first mode register 230 may output a pre-charge pulse synchronized with the clock CK or the third clock SCK. The first mode register 230 may receive a write signal WRITE from the command decoder 130. The first mode register 230 may generate a pre-charge pulse PRE through external information MRS and the write signal WRITE. The first mode register 230 may transmit the pre-charge pulse PRE to the control logic 160.

The first mode register 230 may select a plurality of operation modes. As an example, the first mode register 230 may select any one of a first mode in which the pre-charge pulse PRE is not generated, and a second mode in which the pre-charge pulse PRE is generated.

The first mode is a mode in which the control logic 160 does not divide the write operation for the write command of the same address XA, and the second mode is a mode in which the control logic 160 divides the write operation even for the write command of the same address XA. In the second mode, the pre-charge pulse PRE may be applied to the control logic 160.

Further, the first mode register 230 may also select the third mode. The third mode is a mode that generates the pre-charge pulse PRE like the second mode, but the application cycle of the pre-charge pulse PRE may be different from that of the second mode. That is, in the third mode, although the write operation is divided, the write operation may be divided more or less than the second mode.

The control logic 160 may receive the pre-charge pulse PRE. The control logic 160 may change the word-line-on signal WL_ON and the write driver enable signal WREN from high to low in a period of a predetermined period of time when receiving the pre-charge pulse PRE. For example, the control logic 160 may terminate the word-line-on signal WL_ON and the write driver enable signal WREN and apply another word-line-on signal and another write driver enable signal in response to the pre-charge pulse PRE, thereby applying multiple word-line-on signals and multiple write driver enable signals when a write operation is performed at a given address XA. In this case, the word-line-on signal WL_ON may be referred to as a divided word-line-on signal and the multiple word-line-on signals may be referred to as multiple sub-word-line-on signals. This enables the write operation to be divided and executed several times for the write command of the same address XA.

The memory device according to the present embodiment may execute various write operation modes according to the characteristics of the write error rate. For example, if the memory device may have a low write error rate when the write time is kept long, the first mode register 230 receives the external information MRS representing such characteristics, and may not transmit the pre-charge pulse PRE to the control logic 160 operation during the write time.

In contrast, if the memory device may have a low write error rate when the write time is divided and kept short, the first mode register 230 receives external information MRS representing such characteristics, and may transmit the pre-charge pulse PRE of the control logic 160 so that multiple word-line-on signals with shorter write time are generated.

Such external information MRS may be a value specified and fixed in advance at the time of fabricating the memory device. For example, the external information MRS may be provided using a test pin or may be stored in an OTP (one time programmable) module such as a fuse.

Therefore, whatever the characteristics of the write error rate of the part of the cell array 180 coupled to the memory device according to the present embodiment are, the characteristics may be optimized by the first mode register 230 and the control logic 160.

Alternatively, in the memory device according to the present embodiment, the external information MRS may be adjusted in real time in accordance with the user's input. Therefore, even when the characteristics of the part of the cell array 180 change or need to be adjusted in real time, the optimized write operation may be performed through the adjustment of the external information MRS.

Figure 12:
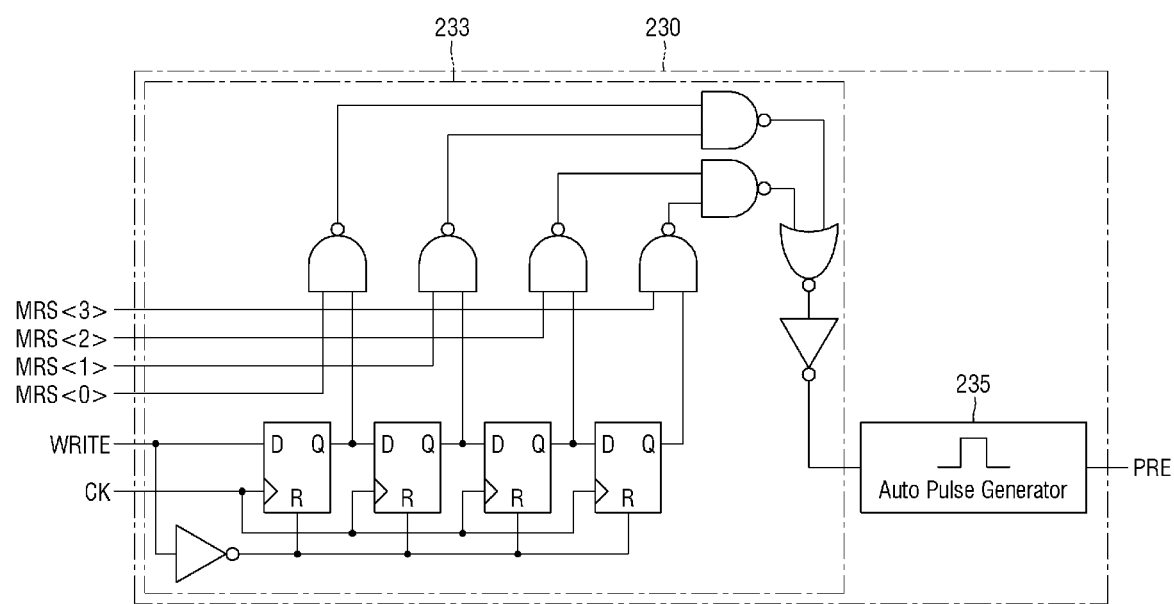
FIG. 12 is a logic circuit diagram for explaining a mode register of FIG. 11 in detail.

FIG. 12 is a logic circuit diagram for explain the mode register of FIG. 11 in detail.

Referring to FIGS. 11 and 12, the first mode register 230 may include signal logic 233 and an auto pulse generator 235.

The signal logic 233 may be a part that receives the external information MRS to generate a pre-charge signal. The signal logic 233 may synchronize the write signal WRITE with the clock CK. The present invention is not limited thereto. In an example embodiment, the signal logic 233 may synchronize the write signal WRITE with the third clock SCK. At this time, the external information MRS may include, for example, four signals of first to fourth external information MRS<0> to MRS<3>. However, this is only an example, and the number of external information MRS may vary.

The signal logic 233 may include a plurality of D flip flops. The number of the plurality of D flip flops may be the same as the number of external information MRS. The D flip-flop may be reset when the write signal WRITE becomes low. The signal logic 233 may generate a pre-charge signal when any of the first to fourth external information MRS<0> to MRS<3> is applied to high.

The auto pulse generator 235 may convert the pre-charge signal into a pre-charge pulse PRE in the pulse form. Accordingly, the pre-charge pulse PRE may be transmitted to the control logic 160.

Figure 13:
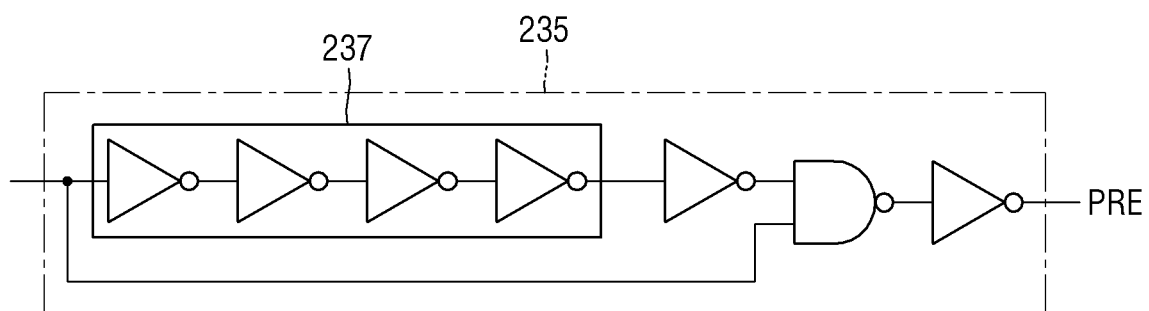
FIG. 13 is a logic circuit diagram for explaining an auto pulse generator of FIG. 12 in detail.

FIG. 13 is a logic circuit diagram for explaining the auto pulse generator of FIG. 12 in detail.

Referring to FIG. 13, the auto pulse generator 235 may include a delay chain 237, a NAND gate and an inverter.

The delay chain 237 may include a plurality of inverters therein. The delay chain 237 may generate a delay between the input and the output. Thus, the auto pulse generator 235 may convert the pre-charge signal of the signal logic 233 into a pre-charge pulse PRE in the form of a pulse.

Figure 14:
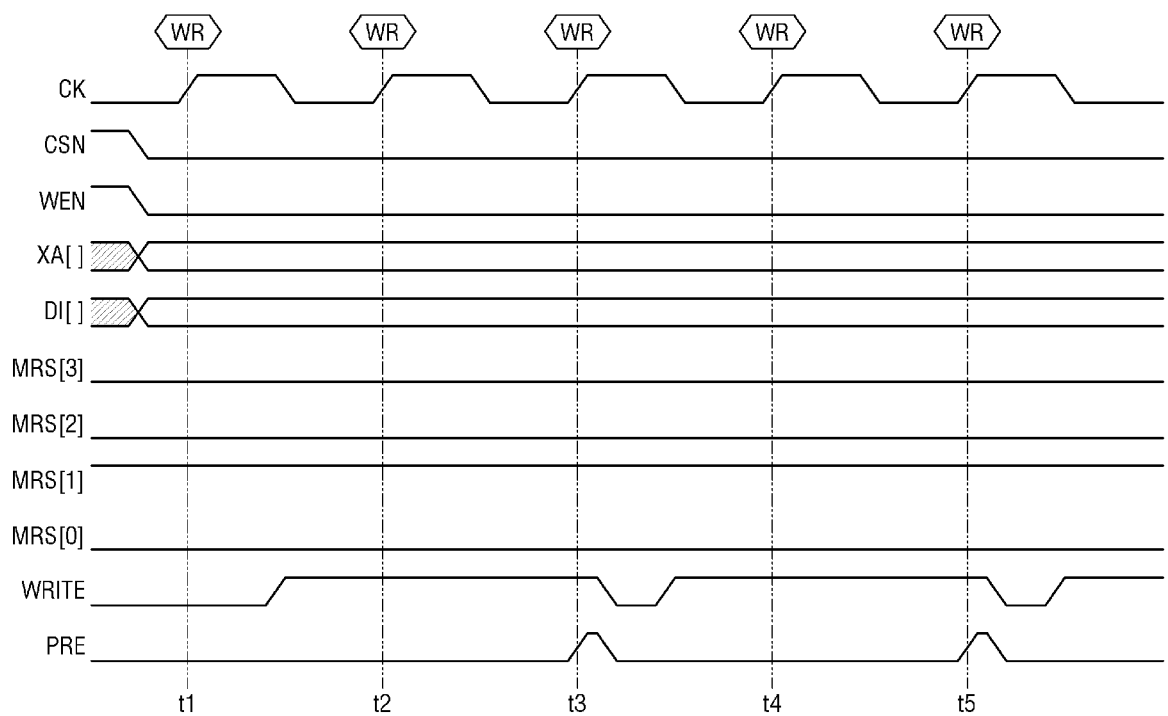
FIG. 14 is a timing diagram for explaining the operation of the mode register of FIG. 11 in accordance with the time.

FIG. 14 is a timing diagram for explaining the operation of the mode register of FIG. 11 in accordance with time.

Referring to FIG. 14, as an example, only the second external information MRS<1> among the first to fourth external information MRS<0> to MRS<3> may be applied to high, and the rest may be applied to low. The first mode register 230 may generate a pre-charge pulse PRE when any one of the first to fourth external information MRS<0> to MRS<3> is applied to high.

Figure 15:
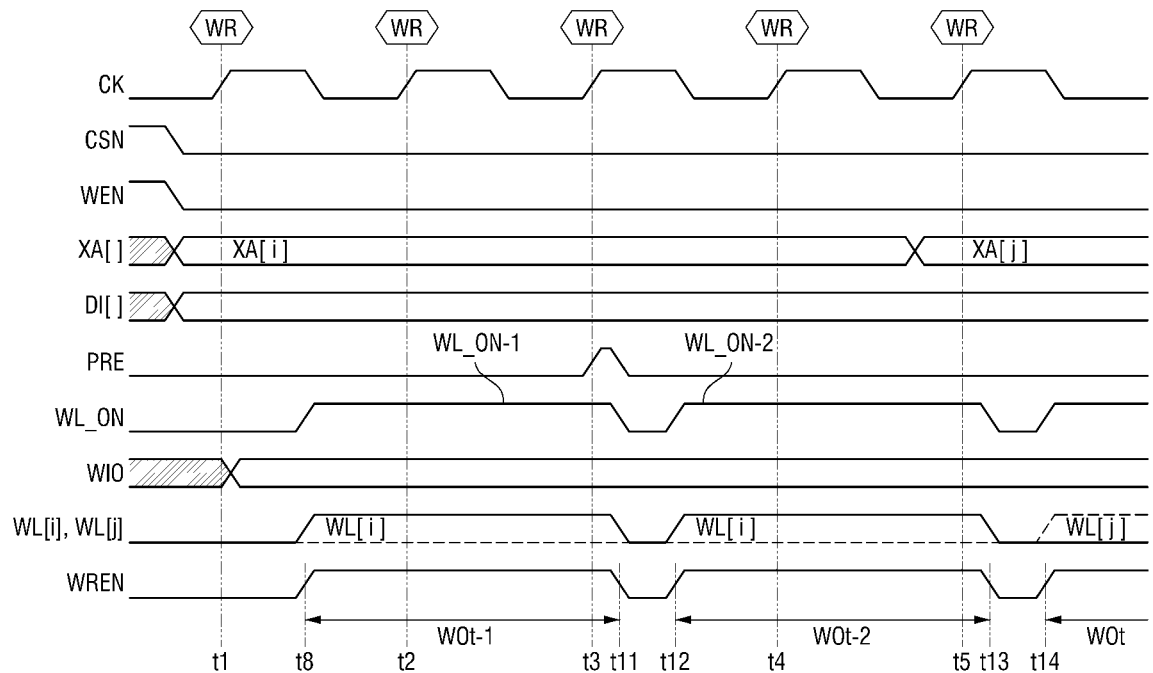
FIG. 15 is a timing diagram for explaining the operation of the memory device of FIG. 11 in accordance with the time.

FIG. 15 is a timing diagram for explaining the operation of the memory device of FIG. 11 in accordance with time.

Referring to FIGS. 11 through 15, the word-line-on signal WL_ON may be converted from high to low by the control logic 160, when the address of the write command is changed or a pre-charge pulse PRE is applied.

Similarly, the write driver enable signal WREN may also be changed from high to low by the control logic 160, when the address (XA[ ]) of the write command WR is changed or the pre-charge pulse PRE is applied.

Therefore, the write operation time Wot of FIG. 7 may be divided in the write command WR of the same address XA into multiple write operation times each of which is determined by a corresponding word-line-on-signal WL_ON (i.e., a corresponding sub-word-line-on signal). Specifically, the write operation time WOt may be divided into a first write operation time Wot-1 from the eighth time point t8 to the eleventh time point t11, and a second write operation time Wot-2 from the twelfth time point t12 to the thirteenth time point t13, by the pre-charge pulse PRE. In an exemplary embodiment, the first write operation time Wot-1 may start in response to a rising edge of a write signal WRITE and end in response to the pre-charge pulse PRE, and the second write operation time Wot-2 may start in response to the pre-charge pulse PRE and end in response to the transition detection signal ADDR_DETB as described in FIG. 7. Between the eleventh time point t11 and the twelfth time point t12, no write operation is performed. Therefore, the ON ratio of the write operation time WOt may be reduced to be less than 100%. At this time, the magnitude of each of the divided write operation times WOt may be the same. For example, the first write operation time Wot-1 may be performed in a pulse width of a first word-line-on signal WL_ON-1 and the second write operation time Wot-2 may be performed in a pulse width of a second word-line-on signal WL_ON-2. In an exemplary embodiment, the first word-line-on signal WL_ON-1 and the second word-line-on signal WL_ON-2 may have the same pulse width. However, the present embodiment is not limited thereto.

Also, even when the address (XA[ ]) changes, the write operation time WOt may end. Therefore, a new write operation time WOt may be started from the fourteenth time point t14 by a new address (XA[ ]).

Hereinafter, the memory device according to some embodiments of the present inventive concept will be described with reference to FIG. 16. Repeated parts of the aforementioned embodiment will be simplified or omitted.

Figure 16:
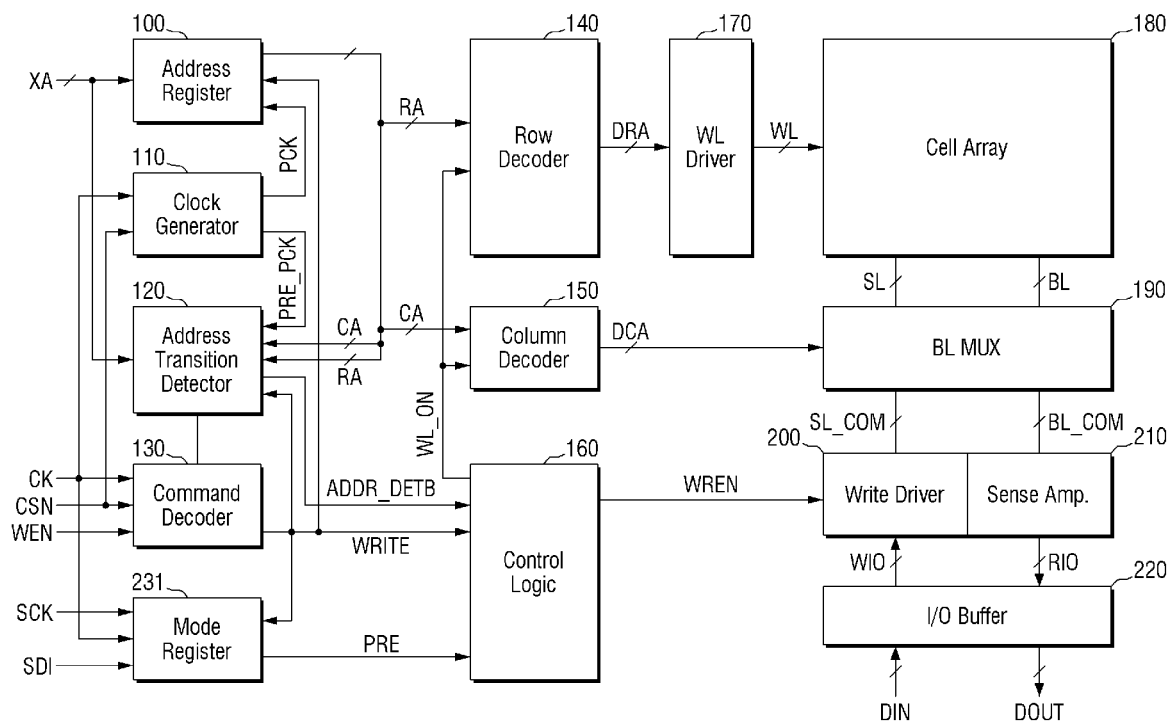
FIG. 16 is a block diagram for explaining the memory device according to some embodiments of the present inventive concept.

FIG. 16 is a block diagram for explaining the memory device according to some embodiments of the present inventive concept.

Referring to FIG. 16, the memory device according to some embodiments of the present inventive concept may include a second mode register 231.

The second mode register 231 may receive internal information SDI from the inside of the device. The second mode register 231 may receive the third clock SCK from the outside. Although FIG. 16 illustrates that the second mode register 231 receives both the clock CK and the third clock SCK, it is also possible to receive only one of the clock CK and the third clock SCK.

The second mode register 231 may output a pre-charge pulse PRE synchronized with the clock CK or the third clock SCK. The second mode register 231 may receive the write signal WRITE from the command decoder 130. The second mode register 231 may generate the pre-charge pulse PRE through the internal information SDI and the write signal WRITE. The second mode register 231 may transmit the pre-charge pulse PRE to the control logic 160.

The internal information SDI may be, for example, the write current of the magnetic random access memory. That is, when the memory device is a magnetic random access memory, if the write operation is performed, the magnetization direction of the free layer may be switched, while the write current flows through the memory cells of the cell array 180. If the magnitude of the write current (i.e., the switching current) is small (i.e., less than a reference value), the write operations may be divided and the write operations are executed several times to lower the write error rate. However, when the magnitude of the switching current is large (i.e., greater than the reference value), the write operation may be kept as long as possible without being divided to lower the write error rate.

The second mode register 231 may determine the magnitude of the switching current therein. In an exemplary embodiment, the second mode register 231 may include a comparator receiving the reference value and the write current and output a comparison result thereof. If the magnitude of the switching current is equal to or less than the reference value, the pre-charge pulse PRE may be applied to the control logic 160, and if the magnitude of the switching current is equal to or greater than the reference value, the pre-charge pulse PRE may not be applied to the control logic 160.

Therefore, the control logic 160 may divide or keep the write operation time WOt. If the pre-charge pulse PRE is applied, it is possible to determine how much operation the write operation time WOt is divided into, in accordance with the value set in the second mode register 231.

In concluding the detailed description, those skilled in the art will appreciate that many variations and modifications may be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A memory device comprising:
a cell array including a plurality of cells;
an address transition detector configured to output a transition detection signal as to whether an address of a write command is changed; and
a control logic circuit configured to generate one of a plurality of word-line-on signals for performing a write operation on the cell array in response to the write command and terminate the write operation in accordance with the transition detection signal,
wherein the plurality of word-line-on signals include a first word-line-on signal that stays active before the address is changed and a second word-line-on signal that is divided into a plurality of sub-word-line-on signals before the address is changed.

2. The memory device of claim 1, further comprising:
a mode register configured to receive external information to generate a pre-charge pulse,
wherein the control logic circuit is further configured to generate the one of the plurality of word-line-on signals on the basis of the pre-charge pulse.

3. The memory device of claim 2,
wherein the second word-line-on signal includes a first sub-word-line-on signal and a second sub-word-line-on signal that are separated from each other by the pre-charge pulse.

4. The memory device of claim 3,
wherein the first sub-word-line-on signal and the second sub-word-line-on signal have the same pulse width.

5. The memory device of claim 1,
wherein the memory device includes at least one of a phase-change random access memory (PRAM), a magnetic random access memory (Magnetic RAM, MRAM), a resistive random access memory (Resistive RAM, RRAM) and a ferroelectric random access memory (Ferroelectric RAM, FRAM).

6. The memory device of claim 1,
wherein the memory device is a magnetic random access memory, and the memory device further comprises a mode register configured to generate a pre-charge pulse in accordance with a magnitude of a switching current of the magnetic random access memory, and
wherein the control logic circuit is further configured to generate the one of the plurality of word-line-on signals on the basis of the pre-charge pulse.

* * * * *